(12) United States Patent  
Wickersham et al.

(10) Patent No.: US 7,741,881 B2
(45) Date of Patent: Jun. 22, 2010

(54) MOSFET GATE INTERFACE

(75) Inventors: Robert D. Wickersham, Roy, WA (US); William Rider, Shelton, WA (US)

(73) Assignee: Intel Corporation, Santa Clara, CA (US)

( * ) Notice: Subject to any disclaimer, the term of this patent is extended or adjusted under 35 U.S.C. 154(b) by 206 days.

(21) Appl. No.: 11/694,928

(22) Filed: Mar. 30, 2007

(65) Prior Publication Data

US 2008/0238528 A1 Oct. 2, 2008

(51) Int. Cl.
*H03K 3/00* (2006.01)
(52) U.S. Cl. .................................. 327/108; 327/434
(58) Field of Classification Search .............. 327/108, 327/434
See application file for complete search history.

(56) References Cited

U.S. PATENT DOCUMENTS

| | | | | |
|---|---|---|---|---|
| 4,052,623 A | * | 10/1977 | Loberg | 327/304 |
| 4,443,719 A | * | 4/1984 | Planer et al. | 327/421 |
| 4,885,486 A | * | 12/1989 | Shekhawat et al. | 327/377 |
| 4,949,213 A | * | 8/1990 | Sasagawa et al. | 361/91.4 |
| 5,103,148 A | * | 4/1992 | Berringer et al. | 318/432 |
| 5,481,219 A | * | 1/1996 | Jacobs et al. | 327/434 |
| 5,828,242 A | * | 10/1998 | Danstrom | 327/67 |
| 5,828,244 A | * | 10/1998 | Palara et al. | 327/108 |
| 5,880,611 A | * | 3/1999 | Danstrom | 327/142 |
| 5,963,078 A | * | 10/1999 | Wallace | 327/432 |
| 6,781,422 B1 | * | 8/2004 | Yang | 327/108 |
| 7,113,412 B2 | * | 9/2006 | Shao et al. | 363/18 |
| 7,495,478 B2 | * | 2/2009 | Takeuchi et al. | 327/51 |

* cited by examiner

*Primary Examiner*—Kenneth B. Wells
(74) *Attorney, Agent, or Firm*—Robert D. Anderson

(57) ABSTRACT

In some embodiments a power circuit includes a driver output, a MOSFET, and circuitry to ensure a full and fast positive drive to a gate of the MOSFET when the driver output goes to a high signal level, and to ensure a full and fast low negative drive to the gate of the MOSFET when the driver output goes to a low signal level. Other embodiments are described and claimed.

16 Claims, 4 Drawing Sheets

US 7,741,881 B2

MOSFET GATE INTERFACE

TECHNICAL FIELD

The inventions generally relate to a MOSFET gate interface.

BACKGROUND

Computer and/or server users are requiring better power conversion efficiency for a variety of reasons, including for example, energy costs, thermal cooling issues, and/or fan noise issues. Typical high current, lower cost high power Metal Oxide Semiconductor Field Effect Transistors (MOSFETs) used in power conversion circuitry have a large total gate charge that makes it difficult for standard gate drivers to efficiently drive the MOSFETs. MOSFETs with lower gate charges cost a premium amount, and also still typically have some cross conduction and other issues. Therefore, it would be beneficial to have a power conversion circuit that improves power conversion efficiency and that eliminates power consuming issues such as cross conduction, dead time, and/or other efficiency issues.

BRIEF DESCRIPTION OF THE DRAWINGS

The inventions will be understood more fully from the detailed description given below and from the accompanying drawings of some embodiments of the inventions which, however, should not be taken to limit the inventions to the specific embodiments described, but are for explanation and understanding only.

DETAILED DESCRIPTION

Some embodiments of the inventions relate to a Metal Oxide Semiconductor Field Effect Transistor (MOSFET) gate interface.

In some embodiments a power circuit includes a driver output, a MOSFET, and circuitry to ensure a full and fast positive drive to a gate of the MOSFET when the driver output goes to a high signal level, and to ensure a full and fast low negative drive to the gate of the MOSFET when the driver output goes to a low signal level.

The impedance that drives high capacity MOSFET gates must be much less than one ohm to prevent issues such as cross conduction, Qrr (reverse recovery time) switching losses, and/or other issues. Most MOSFET gate drivers have an impedance greater than one ohm, and are also limited in drive current. The distance from the driver to the MOSFET gate also adds resistance and inductance in series with the driver.

Figure 1:
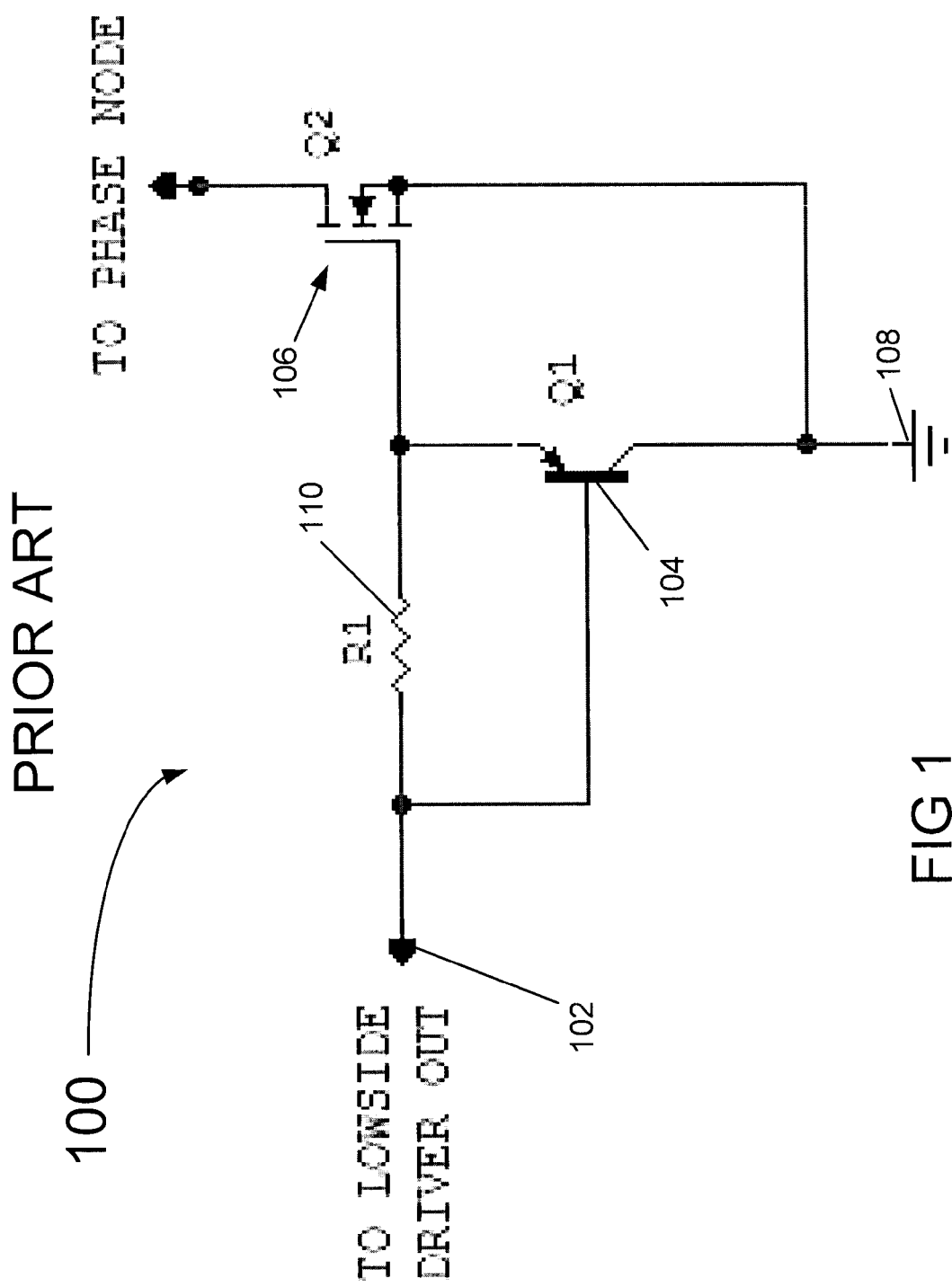
FIG. 1 illustrates a prior art power circuit.

FIG. 1 illustrates a prior art power circuit 100 (for example, a power conversion circuit and/or an interface circuit within a power conversion circuit). Power circuit 100 includes and/or is included within a power converter, a power regulator, a buck converter, and/or a buck regulator). Power circuit 100 includes a gate driver 102 that is coupled to the base of a PNP bipolar transistor 104. The emitter of PNP transistor 104 is coupled to a MOSFET gate 106, and the collector of PNP transistor 104 is coupled to a ground voltage 108. A resistor 110 is coupled between the driver output 102 and the MOSFET gate 106. One limitation to the power conversion circuit 100 of FIG. 1 is that the emitter of the PNP transistor 104 is not effective below 0.6 or 0.7 volts, and gate resistance and conductance will usually still allow the MOSFET 106 to go into cross conduction. Another limitation to the power circuit 100 of FIG. 1 is the series resistor 110 will slow up the MOSFET 106 from turning on, which increases dead time losses.

Figure 2:
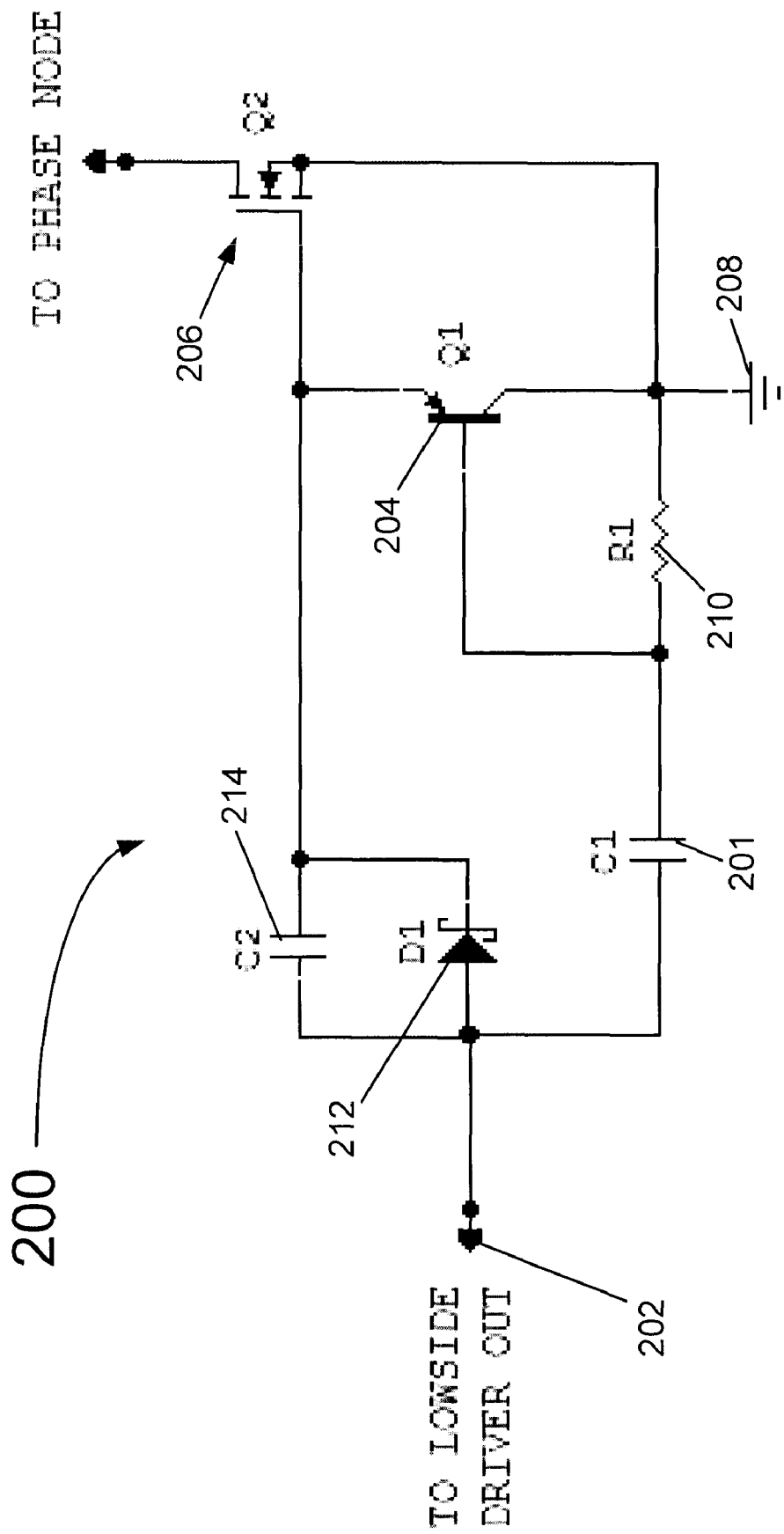
FIG. 2 illustrates a power circuit according to some embodiments of the inventions.

FIG. 2 illustrates a power circuit 200 according to some embodiments (for example, a power conversion circuit and/or an interface circuit within a power conversion circuit). In some embodiments, for example, power circuit 200 includes and/or is included within a power converter, a power regulator, a buck converter, and/or a buck regulator). Power circuit 200 includes a capacitor 201 coupled in series with a bottom MOSFET driver output 202 and a base of a PNP bipolar transistor 204. A collector of PNP transistor 204 is coupled to the source of a bottom MOSFET 206. An emitter of PNP transistor 204 is coupled to a gate of MOSFET 206. A collector of PNP transistor 204 is coupled to a ground voltage 208. A resistor 210 is coupled between the capacitor 201 and the base of transistor 204 at a first terminal, and the collector of transistor 204, the ground voltage 208, and the source of the MOSFET 206 at a second terminal. A diode 212 has an anode coupled to the driver output 202 and a cathode coupled to the gate of MOSFET 206. A capacitor 214 is also coupled to the driver output 202 and the gate of MOSFET 206. Capacitor 214 bypasses diode 212 to provide a faster response appearing at the gate of MOSFET 206.

When the driver output 202 goes high, the positive signal goes through diode 212 and directly to the gate of MOSFET 206. This ensures a full fast positive drive to the gate. When the driver output 202 goes low, this low-going signal goes through capacitor 201 to the base of the PNP bipolar transistor 204, turning the transistor 204 fully down to zero volts at the emitter. The bottom MOSFET gate driver 202 usually has a relatively slow going negative slope. This is due in part to the large gate capacitance typically found in bottom MOSFETs. The capacitor 214 coupled in parallel with diode 212 increases the speed of the low going signal to the gate of MOSFET 206. When the base of the PNP bipolar transistor 204 is pulled low by capacitor 201, the transistor 204 conducts to pull the gate toward the source of MOSFET 206, which in this implementation is ground. Capacitor 214 has already started the negative-going process and can actually pull the gate of MOSFET 206 below ground during the Qrr (reverse recovery time) of a body diode of MOSFET 206 and can perform a full turn-on of the top MOSFET. Resistor 210 biases the output of capacitor 201 to a ground potential voltage. In this manner, the power circuit 200 does not require very low impedance from the driver, since it relies on basically driving the base of the bipolar transistor 204.

Figure 2A:
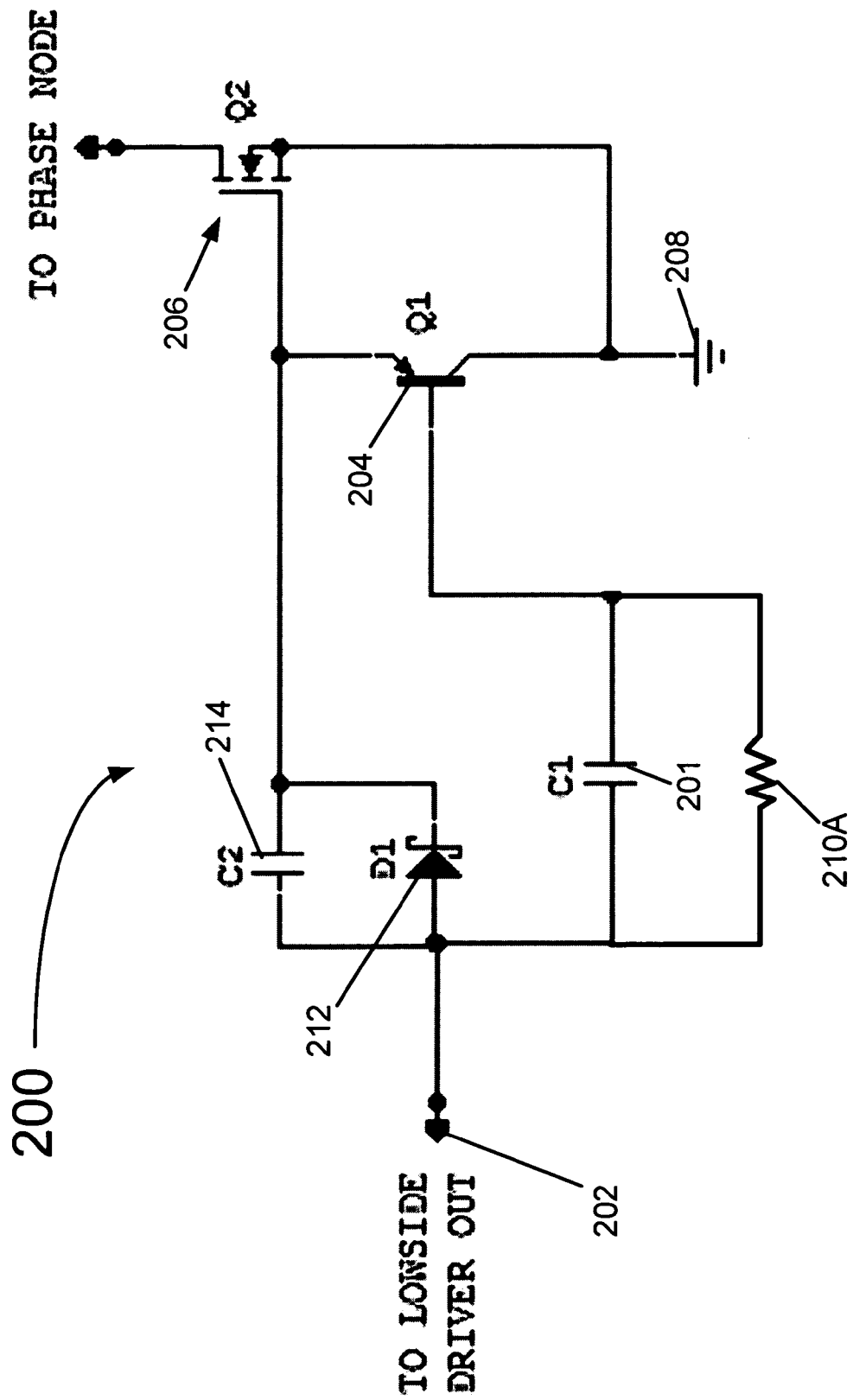
FIG. 2A illustrates a power circuit according to some embodiments of the inventions.

In FIG. 2 resistor 210 is illustrated as being coupled to ground 208. However, in some embodiments instead of being coupled to ground voltage 208, resistor 210 is instead coupled in parallel with capacitor 201 with a first terminal coupled to the driver output 202 and a second terminal coupled to the base of PNP bipolar transistor 204 (this resistor is referred to herein as "resistor 210A" and is illustrated in FIG. 2A). In such an embodiment there is no longer a circuit element coupled between the base of transistor 204 and the ground voltage 208. A resistor 210A coupled in parallel with capacitor 201 allows a direct connection from the driver output 202 to the base of transistor 204. For example, when there is a long time period where the gate is low, then resistor 210A is biased to ground voltage potential. When there is a high voltage potential provided from driver output 202, a better situation is provided by resistor 21QA where a positive bias continues on the bipolar transistor 204 to help it turn off.

Figure 3:
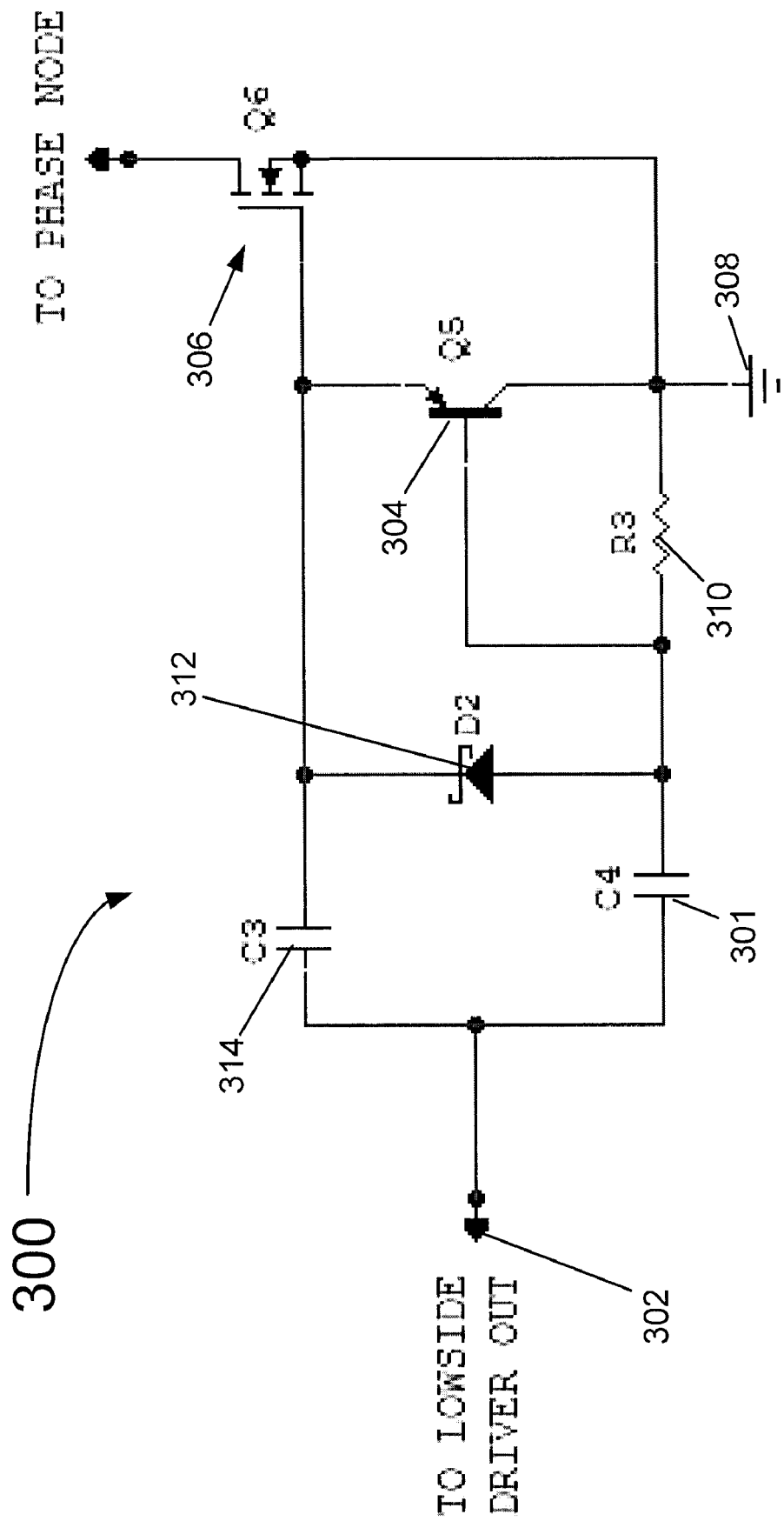
FIG. 3 illustrates a power circuit according to some embodiments of the inventions.

FIG. 3 illustrates a power circuit 300 according to some embodiments (for example, a power conversion circuit and/or an interface circuit within a power conversion circuit). In some embodiments, for example, power circuit 300 includes and/or is included within a power converter, a power regulator, a buck converter, and/or a buck regulator). Power circuit 300 includes a capacitor 301, a gate driver 302, a PNP bipolar transistor 304, a MOSFET 306, a ground voltage 308, a resistor 310, a diode 312, and a capacitor 314. Power circuit 300 operates in a similar manner as power circuit 200 with a slight difference. Diode 312 has its anode coupled to an output of capacitor 301. This provides a little bit less positive voltage on the gate of the bottom MOSFET 306 than the implementation of FIG. 2, but the gate voltage starts the negative pulldown at a lower voltage and pulls the gate to a negative voltage at the critical Qrr time (reverse recovery time) and the top turn-on time. This helps to further ensure a rapid turn-off of the bottom MOSFET 306.

In FIG. 3 resistor 310 is illustrated as being coupled to ground 308. However, in some embodiments instead of being coupled to ground voltage 308, resistor 310 is instead coupled in parallel with capacitor 301 with a first terminal coupled to the driver output 302 and a second terminal coupled to the base of PNP bipolar transistor 304 (this resistor is referred to herein as "resistor 310A"). In such an embodiment there is no longer a circuit element coupled between the base of transistor 304 and the ground voltage 308. A resistor 310A coupled in parallel with capacitor 301 allows a direct connection from the driver output 302 to the base of transistor 304. For example, when there is a long time period where the gate is low, then resistor 310A is biased to ground voltage potential. When there is a high voltage potential provided from driver output 302, a better situation is provided by resistor 310A where a positive bias continues on the bipolar transistor 304 to help it turn off.

In some embodiments efficiency is improved and lower cost bottom MOSFETs may be used in power conversion circuitry (for example, in power converters, power regulators, buck converters, and/or buck regulators).

In some embodiments, a low cost increase of efficiency is provided by fully turning off a bottom MOSFET in power conversion circuitry. In some embodiments low cost MOSFETs may be used and high efficiency yields may be obtained.

In some embodiments power conversion circuitry is improved by economically interfacing the bottom MOSFET gate for better drive and eliminating power consuming issues such as cross conduction, dead time, and/or other efficiency issues.

Although some embodiments have been described herein as being particular implementations and/or circuits, according to some embodiments these particular implementations may not be required. For example, although some embodiments have been described herein as being power conversion circuits. However, in some embodiments these circuits are interface circuits included within power conversion circuits. In any case, the interface circuits included within power conversion circuits as used herein are considered to be power conversion circuits.

Although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other form of propagated signals (e.g., carrier waves, infrared signals, digital signals, the interfaces that transmit and/or receive signals, etc.), and others.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Although flow diagrams and/or state diagrams may have been used herein to describe embodiments, the inventions are not limited to those diagrams or to corresponding descriptions herein. For example, flow need not move through each illustrated box or state or in exactly the same order as illustrated and described herein.

The inventions are not restricted to the particular details listed herein. Indeed, those skilled in the art having the benefit of this disclosure will appreciate that many other variations from the foregoing description and drawings may be made within the scope of the present inventions. Accordingly, it is the following claims including any amendments thereto that define the scope of the inventions.

What is claimed is:

1. A power circuit comprising:
   a driver output;
   a MOSFET; and
   circuitry to ensure a positive drive to a gate of the MOSFET when the driver output goes to a first signal level, and to ensure a low negative drive to the gate of the MOSFET when the driver output goes to a second signal level, wherein the circuitry includes:
   a PNP bipolar transistor;
   a first capacitor coupled between the driver output and a base of the PNP bipolar transistor, wherein the capacitor drives the base of the PNP bipolar transistor;
   a diode coupled to the gate of the MOSFET; and
   a second capacitor coupled between the driver output and the gate of the MOSFET, wherein the second capacitor is coupled in parallel with the diode.

2. The power circuit of claim 1, wherein the diode is coupled between the driver output and the gate of the MOSFET.

3. The power circuit of claim 2, wherein an anode of the diode is coupled to the driver output and a cathode of the diode is coupled to the gate of the MOSFET.

4. The power circuit of claim 1, wherein:
   the diode is coupled between the driver output and the gate of the MOSFET.

5. The power circuit of claim 1, wherein the MOSFET gate is a bottom MOSFET gate.

6. The power circuit of claim 1, wherein the power circuit is a power conversion circuit.

7. The power circuit of claim 1, wherein the power circuit is an interface circuit included within a power conversion circuit.

8. The power circuit of claim 1, the circuitry further including a resistor having a first terminal coupled to the base of the PNP bipolar transistor and to the first capacitor and having a second terminal coupled to a collector of the PNP bipolar transistor and coupled to a source of the MOSFET.

9. The power circuit of claim 1, the circuitry further including a resistor having a first terminal coupled to the first capacitor, the diode, and the base of the PNP bipolar transistor, and having a second terminal coupled to a collector of the PNP bipolar transistor and to a source of the MOSFET.

10. The power circuit of claim 1, the circuitry further including a resistor coupled in parallel with the first capacitor, the resistor having a first terminal coupled to the driver output and a second terminal coupled to the base of the PNP bipolar transistor.

11. A power circuit comprising:
    a driver output;
    a MOSFET; and
    circuitry to ensure a positive drive to a gate of the MOSFET when the driver output goes to a first signal level, and to ensure a low negative drive to the gate of the MOSFET when the driver output goes to a second signal level, wherein the circuitry includes:
    a PNP bipolar transistor;
    a first capacitor coupled between the driver output and a base of the PNP bipolar transistor, wherein the capacitor drives the base of the PNP bipolar transistor;
    a diode coupled to the gate of the MOSFET; and
    a second capacitor coupled between the driver output and the gate of the MOSFET, wherein the diode is directly coupled between the driver output and the gate of the MOSFET.

12. A power circuit comprising:
    a driver output;
    a MOSFET; and
    circuitry to ensure a positive drive to a gate of the MOSFET when the driver output goes to a first signal level, and to ensure a low negative drive to the gate of the MOSFET when the driver output goes to a second signal level, wherein the circuitry includes:
    a PNP bipolar transistor;
    a first capacitor coupled between the driver output and a base of the PNP bipolar transistor, wherein the capacitor drives the base of the PNP bipolar transistor;
    a diode coupled to the gate of the MOSFET; and
    a second capacitor coupled between the driver output and the gate of the MOSFET, wherein the diode is coupled between the gate of the MOSFET and the base of the PNP bipolar transistor.

13. A power circuit comprising:
    a driver output;
    a MOSFET; and
    circuitry to ensure a positive drive to a gate of the MOSFET when the driver output goes to a first signal level, and to ensure a low negative drive to the gate of the MOSFET when the driver output goes to a second signal level, wherein the circuitry includes:
    a PNP bipolar transistor;
    a first capacitor coupled between the driver output and a base of the PNP bipolar transistor, wherein the capacitor drives the base of the PNP bipolar transistor;
    a diode coupled to the gate of the MOSFET; and
    a second capacitor coupled between the driver output and the gate of the MOSFET, wherein:
    the PNP bipolar transistor includes an emitter, the base, and a collector;
    the diode is coupled between the driver output and the gate of the MOSFET;
    the second capacitor is coupled in parallel with the diode; and
    the emitter of the PNP bipolar transistor is coupled to the gate of the MOSFET, to the second capacitor, and to the diode;
    the circuitry further including a resistor having a first terminal coupled to the base of the PNP bipolar transistor and to the first capacitor and having a second terminal coupled to the collector of the PNP bipolar transistor and coupled to a source of the MOSFET.

14. A power circuit comprising:
    a driver output;
    a MOSFET; and
    circuitry to ensure a positive drive to a gate of the MOSFET when the driver output goes to a first signal level, and to ensure a low negative drive to the gate of the MOSFET when the driver output goes to a second signal level, wherein the circuitry includes:
    a PNP bipolar transistor;
    a first capacitor coupled between the driver output and a base of the PNP bipolar transistor, wherein the capacitor drives the base of the PNP bipolar transistor;
    a diode coupled to the gate of the MOSFET; and
    a second capacitor coupled between the driver output and the gate of the MOSFET, wherein:
    the PNP bipolar transistor includes an emitter, the base, and a collector;

the diode is coupled between the gate of the MOSFET and the base of the PNP bipolar transistor; and the emitter of the PNP bipolar transistor is coupled to the gate of the MOSFET, to the second capacitor, and to the diode;

the circuitry further including a resistor having a first terminal coupled to the first capacitor, the diode, and the base of the PNP bipolar transistor, and having a second terminal coupled to the collector of the PNP bipolar transistor and to a source of the MOSFET.

15. A power circuit comprising:

a driver output;

a MOSFET; and circuitry to ensure a positive drive to a gate of the MOSFET when the driver output goes to a first signal level, and to ensure a low negative drive to the gate of the MOSFET when the driver output goes to a second signal level, wherein the circuitry includes:

a PNP bipolar transistor;

a first capacitor coupled between the driver output and a base of the PNP bipolar transistor, wherein the capacitor drives the base of the PNP bipolar transistor;

a diode coupled to the gate of the MOSFET; and a second capacitor coupled between the driver output and the gate of the MOSFET, wherein:

the PNP bipolar transistor includes an emitter, the base, and a collector;

the diode is coupled between the driver output and the gate of the MOSFET;

a the second capacitor is coupled in parallel with the diode; and the emitter of the PNP bipolar transistor is coupled to the gate of the MOSFET, to the second capacitor, and to the diode;

the circuitry further including a resistor having a first terminal coupled to the first capacitor, the diode, and the base of the PNP bipolar transistor, and having a second terminal coupled to the collector of the PNP bipolar transistor and to a source of the MOSFET.

16. A power circuit comprising:

a driver output;

a MOSFET; and circuitry to ensure a positive drive to a gate of the MOSFET when the driver output goes to a first signal level, and to ensure a low negative drive to the gate of the MOSFET when the driver output goes to a second signal level, wherein the circuitry includes:

a PNP bipolar transistor;

a first capacitor coupled between the driver output and a base of the PNP bipolar transistor, wherein the capacitor drives the base of the PNP bipolar transistor;

a diode coupled to the gate of the MOSFET; and a second capacitor coupled between the driver output and the gate of the MOSFET, wherein:

the PNP bipolar transistor includes an emitter, the base, and a collector;

a the diode is coupled between the gate of the MOSFET and the base of the PNP bipolar transistor; and the emitter of the PNP bipolar transistor is coupled to the gate of the MOSFET, to the second capacitor, and to the diode; and the circuitry further including a resistor coupled in parallel with the first capacitor, the resistor having a first terminal coupled to the driver output and a second terminal coupled to the base of the PNP bipolar transistor.

* * * * *